United States Patent [19]

Wasilousky

[11] Patent Number: 4,771,294
[45] Date of Patent: Sep. 13, 1988

[54] MODULAR INTERFACE FOR MONOLITHIC MILLIMETER WAVE ANTENNA ARRAY

[75] Inventor: Peter A. Wasilousky, Palm Bay, Fla.

[73] Assignee: Harris Corporation, Melbourne, Fla.

[21] Appl. No.: 905,932

[22] Filed: Sep. 10, 1986

[51] Int. Cl.⁴ .................... H05K 3/32; H01Q 23/00
[52] U.S. Cl. .................... 343/853; 333/245; 333/260; 357/80; 357/81; 361/388; 361/392; 174/16 HS
[58] Field of Search ............. 333/247, 248, 245, 260; 343/700 MS File, 701, 853; 342/354, 368, 371, 373, 374, 157, 158, 153; 357/74, 80, 81; 361/381, 382, 386, 388, 392, 395; 174/52 S, 52 H, 16 HS

[56] References Cited

U.S. PATENT DOCUMENTS

| | | | |
|---|---|---|---|
| 3,500,428 | 3/1970 | Allen | 342/371 |
| 3,530,229 | 9/1970 | Burke, Jr. | 361/381 X |
| 3,818,386 | 6/1974 | Granberry | 342/371 X |
| 4,035,807 | 7/1977 | Tong et al. | 343/700 MS X |
| 4,322,778 | 3/1982 | Barbour et al. | 357/74 X |
| 4,396,936 | 8/1983 | McIver et al. | 357/80 X |
| 4,490,721 | 12/1984 | Stockton et al. | 333/247 X |
| 4,536,824 | 8/1985 | Barrett et al. | 361/388 X |
| 4,628,407 | 12/1986 | August et al. | 361/386 X |
| 4,641,140 | 2/1987 | Heckaman et al. | 343/700 MS X |
| 4,667,219 | 5/1987 | Lee et al. | 357/80 X |
| 4,682,270 | 7/1987 | Whitehead et al. | 357/80 X |
| 4,695,810 | 9/1987 | Heckaman et al. | 333/1 |

FOREIGN PATENT DOCUMENTS 0080841 4/1986 Japan ..................... 357/80

Primary Examiner—Eugene R. Laroche
Assistant Examiner—Benny T. Lee
Attorney, Agent, or Firm—Antonelli, Terry & Wands

[57] ABSTRACT

A signal interface/package for MMIC components comprises a laminate of RF chips, socket carrier, wiring board and cold plate/waveguide structure. Input/output pins of the chip modules interface with feedthrough connectors of the carrier. Each chip module is formed of a ceramic substrate which rests atop a heat conductive metallic baseplate. RF coupling ports extend through the baseplate. A coldplate element has a plurality of depressions and pillars, with each depression conforming with the shape of the baseplate. Printed wiring boards contain interconnect wiring layers to connect the signal pins to the outside world. The bottom surface of the coldplate defines a waveguide cavity structure.

27 Claims, 5 Drawing Sheets

MODULAR INTERFACE FOR MONOLITHIC MILLIMETER WAVE ANTENNA ARRAY

FIELD OF THE INVENTION

The present invention relates in general to microwave signal coupling devices and is particularly directed to an arrangement for interfacing extremely high frequency antenna elements incorporated with monolithic integrated circuit devices to external signal coupling ports.

BACKGROUND OF THE INVENTION

Signal distribution networks, particularly those employed with large signal transmission distances, (e.g. radio wave launch devices) typically contain one or more stages of amplification to ensure sufficient power levels at signal reception and recovery sites. In RF signal transmission systems, power distribution from a modulation source to the antenna emitter elements has conventionally been effected by the use of a source amplifier stage the output of which is coupled through a signal distribution network, e.g. waveguide, stripline, to one or more RF emitters. With the continuing increase in the transmitted carrier frequency and improved microwave integrated circuit devices, however, customary approaches to interfacing successive stages of a network may no longer provide an adequate means for RF and low frequency signals to be practically integrated. This is especially true of beam steering transmission type phased array antennas operating in the mm-wave or near mm-wave portion of the RF spectrum.

More particularly, because many of these antennas must be capable of scanning over large angles, constraints imposed on the generation of large grating lobes restricts the emitter element spacing typically to one-half of the free space wavelength. As a result, the integration density of microwave integrated circuit devices employed in the design of these antennas becomes increasingly higher. Where transistors and phase shifters are present, the process of incorporating both high frequency RF, D.C. power and control signals within a single scheme, which provides for large thermal dissipation (owing to the relative inefficiency of current GaAs FETs at mm-wave frequencies), becomes increasingly difficult to implement in a practical manner where the high frequency RF distribution and interfacing is concerned, dimensional tolerances of the physical structure in which the devices are contained become critical design/performance parameters. Consequently, both the length and physical characteristics of signal runs between components may significantly affect (degrade) interstage coupling/impedance characteristics of a network. Small dimensional irregularities at a signal coupling transition may influence the degree to which residual capacitance and inductance are present, causing large variations in input or output impedance at the signal coupling interface. Such constraints are especially critical in compact multielement antenna arrays, as may be employed in high performance military aircraft, where the conventional approach of using an inherently lossy branched conductor network to distribute power from single signal power source suffers unacceptable attenuation.

To obviate this drawback of substantial signal loss through the signal distribution network, antenna arrays employing monolithic integrated RF amplifier/emitter components (namely those with the power amplifier at the emitter site by making both amplifier and antenna emitter reside within the same high speed semiconductor (GaAs) chip) have been proposed. Because of their microminiaturized circuit structure and the above-described signal transmission link limitations, the physical dimensions of signal coupling ports for interfacing such chips with other signal processing hardware have limited their incorporation in large antenna arrays. Moreover, as the density and volume of the array increases, heat dissipation, which is an especially acute requirement for GaAs FETs operating at K-band and above, becomes a significant hardware packaging consideration.

SUMMARY OF THE INVENTION

In accordance with the present invention, there is provided a new and improved signal interface/packaging arrangement for physically and electronically supporting a plurality of high circuit density/high (signal processing) speed monolithic microwave integrated circuit components in a large density array structure that is compact, and therefore readily adaptable to complex environment (e.g. high performance aircraft/spacecraft) applications, affords efficient thermal dissipation and provides a practical interconnect mechanism between the signal coupling ports of each chip and the external world. For this purpose, the present invention embodies a laminated arrangement of a multi RF chip module, a compliant socket carrier, interconnect wiring board and heat dissipating cold plate/waveguide structure.

The multi RF chip module is formed of a first layer of ceramic substrate upon top surface of which a plurality of high frequency (e.g. gallium arsenide) monolithic integrated circuit chips, containing signal amplification, phase shift networks, etc. and antenna emitter elements, are disposed. As a result of conditions mentioned earlier which serve to limit the emitter spacing, and the need to minimize proximity of adjacent circuit elements due to RF coupling, the chips are arranged immediately adjacent to one another and have their signal coupling ports disposed along the outer peripheries thereof. Solid post vias, wirebond-connected to input/output signal coupling ports of the chips, extend through apertures in the first substrate layer to fan-out conductor trace patterns on the top surface of a second ceramic substrate layer. The respective conductor traces of the pattern on the second substrate layer extend to spaced apart locations whereat input/output signal pins are disposed. The input/output signal pin locations on the second substrate layer are spaced apart sufficiently to facilitate physical handling and interfacing with feed-through connectors of the compliant pin socket carrier. RF signal coupling ports of the modules are formed by a pair of center conductor pins wirebond-connected to the chips and extending through respective coaxial cylindrical apertures in the first and second ceramic substrate layers. The walls of the respective apertures are conductive so as to form transmission line ground planes for the center conductor pins extending therethrough.

Affixed to the bottom surface of the second ceramic substrate layer is a metallic baseplate, which provides a heat dissipation path away from the ceramic substrate layers (and the chips mounted thereon) and forms an extension of the ground planes for the center conductor pins of the RF signal coupling ports by way of apertures therethrough aligned with the conductive-walled apertures of the first and second substrate layers. In addition, the baseplate also serves as a structural support element for the ceramic portion of the module, minimizing strain of the non-complaint ceramic resulting from loads generated during attachment of the module to the coldplate. The baseplate is shaped to have a perimeter that lies within the distribution of the input/output signal pins extending from the bottom of the second ceramic substrate layer. The lengths of the input/output signal pins and the center conductor pins of the RF signal coupling ports exceed the thickness of the baseplate. Each module is also provided with a pair of spaced-apart alignment guide posts which extend from the baseplate, and a retaining port through which the module is to be mounted to an underlying cold plate/waveguide structure. The lengths of the guide posts and the retaining post exceed the lengths of the pins so as to ensure mechanical alignment of the pins, primarily the RF center conductor pins, prior to their connection with adjacent interface components.

The coldplate/waveguide structure is a laminated structure comprising a top metallic coldplate element, an interior metallic waveguide transition and load plate element and a bottom metallic waveguide plate element. The coldplate element has a top surface portion in which an arrangement of depressions is provided. Between the depressions, land portions or pillars are defined. The perimeter of each pillar is shaped to effectively conform with the shape of the metallic baseplate of an RF chip module to be placed in contact therewith. Each pillar has a central aperture for receiving the retaining post of a module and a pair of guide post apertures for properly aligning the RF chip module when the module is placed on the pillar. Additional apertures extend through each pillar in alignment with the center conductor pins of the RF signal ports of the RF chip module and contain transmission line feed through sockets which interface the center conductor pins of the RF modules with coaxial pin connector links that are coupled to a ridged waveguide power divider structure defined between the bottom surface of the coldplate element and the top surface of the interior waveguide transition and load plate element therebeneath.

The printed wiring board contains a distributed pattern of interconnect wiring layers which extend to cable connector elements on the side of the board and thereby serve to connect the input/output signal pins of the modules to the outside world. Physical and electrical interfacing of the input/output signal pins of the modules and the printed wiring board is effected by way of the compliant socket carrier inserted between. To enable the printed wiring board to be compactly physically integrated with the coldplate/waveguide structure, the board is configured to have a distribution of slots therethrough shaped to conform with the sidewalls of the pillars of the coldplate element so that, when placed on the coldplate element, the wiring board drops into the depressions and is securely confined by the pillars.

A plurality of compliant socket carriers, each of which is also shaped to match the shape of a depression in the coldplate element, is placed in the depressions of the coldplate/waveguide structure between the bottom surfaces of the RF chips modules and the top surface of the printed wiring board, and serves to guide and interface the input/output signal pins of the RF chip modules with signal interconnect layers of the printed wiring board.

The interior of the coldplate element beneath the depressions is provided with an arrangement of coolant channels. The bottom surface of the coldplate element is shaped or grooved to define a ridged waveguide cavity power divider structure the walls of which are formed by the side and bottom walls of the grooves in the coldplate element and the top surface of the waveguide transition and load plate element placed thereagainst. As described above, the center conductor pins of the RF signal coupling ports of the chip carrier modules are coupled to transmission line connectors which extend through apertures in the coldplate element to the ridged waveguide cavity structure.

The top surface of the bottom waveguide plate element also has a set of grooves the walls of which define the bottom wall and opposite sidewalls of a rectangular waveguide power divider structure. The flat bottom surface of the transition plate forms the top surface of the rectangular waveguide power divider structure. A matrix of interface feed through transitions is formed through the transition plate element to interface the ridged waveguide power divider structure formed between the top of the transition plate element and the bottom of the coldplate element with the rectangular waveguide power divider structure formed between the bottom of the transition plate element and the top of the underlying bottom waveguide plate element.

DETAILED DESCRIPTION

Figure 1:
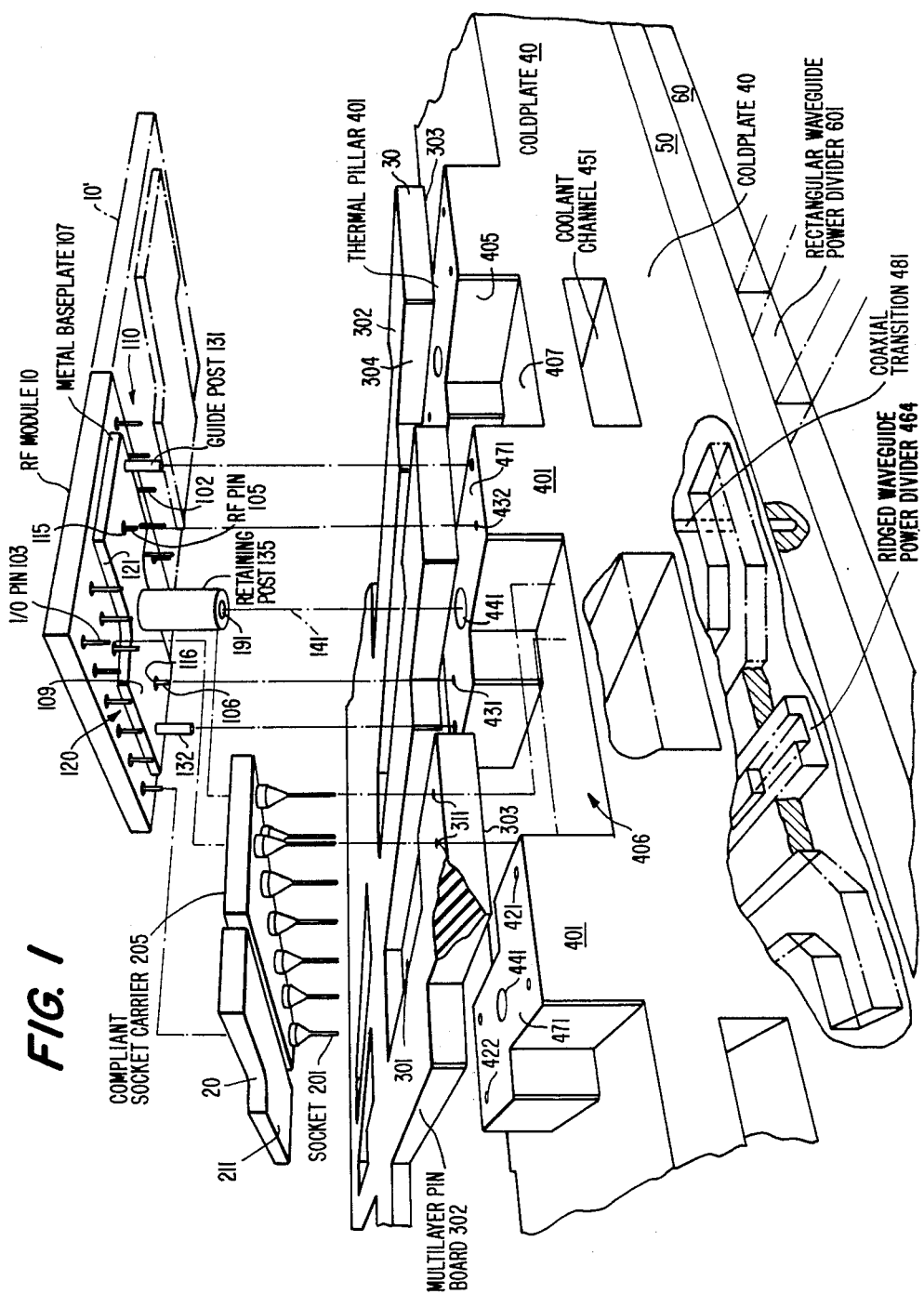
FIG. 1 is an exploded, perspective view of the arrangement of the modular components of a millimeter wave antenna interface in accordance with the present invention.

Referring now to FIG. 1, there is shown, in perspective, an exploded view of the overall structural configuration a module interface for a monolithic millimeter wave antenna array in accordance with the present invention. The antenna itself is comprised of an array of RF chip modules (10') (only one of which is fully illustrated in FIG. 1 in order to simplify the drawing), containing a plurality of microwave integrated circuit signal processing and radiating components that are to be interfaced with external signal coupling ports through which operation of the antenna array is controlled and monitored. For this purpose, each RF chip module 10 may house a plurality of (e.g. four) microwave integrated circuit (e.g. GaAs) chips containing amplifiers, controlled phase shift/switching networks and microwave emitter elements, (shown schematically at 10A, 10E in FIG. 2) such as chips manufactured by Hughes Aircraft Company which operate over a frequency bandwidth of 43 to 45 GHz. (It is to be understood, of course, that the invention is not limited to the use of this particular chip or the frequency range of its operation.)

Figure 2:
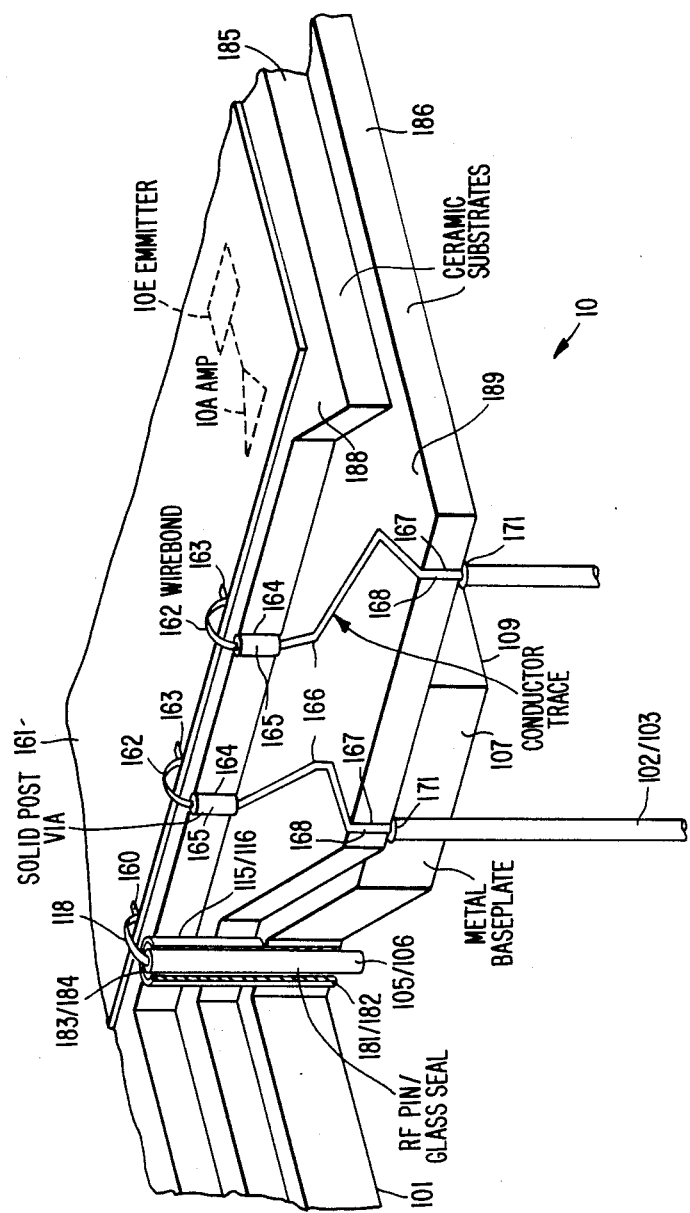
FIG. 2 is a perspective view of a broken away portion of an RF chip module.

As shown in detail in FIG. 2, each RF module 10 contains a plurality of (gallium arsenide) monolithic microwave integrated circuit chips 161 preferably arranged in a side-by-side cluster on the top surface 188 of a multilayer ceramic (e.g. cofired aluminum oxide) chip carrier package, comprised of a first or upper ceramic layer 185 formed on the top surface 189 of a second ceramic substrate layer 186. The ceramic package is hermetically sealed by a cover (shown at 11 in FIGS. 4 and 5 to be described supra, but not illustrated in FIG. 2 in order to show the details of the module's interior). Each microwave integrated circuit chip contains a plurality of input/output signal coupling ports 163 and an RF signal coupling port 160. Because of the extremely close spacing of the circuit components and associated interconnect links on the integrated circuit chips, direct mechanical coupling of signal interface connectors to the circuitry of the chips cannot be realized without the use of extremely fragile hardware components and without possibly damaging the highly brittle structure of the gallium arsenide chips. In accordance with the present invention, the upper ceramic substrate layer 185 to which the array of chips 161 is bonded provides a stress tolerant support backing carrier for the chips 161, while the second ceramic substrate layer 186 forms an additional layer of mechanical support and also provides an interconnect structure that permits the closely spaced signal coupling ports on the edges of the chips to be mechanically externally accessible.

Figure 3:
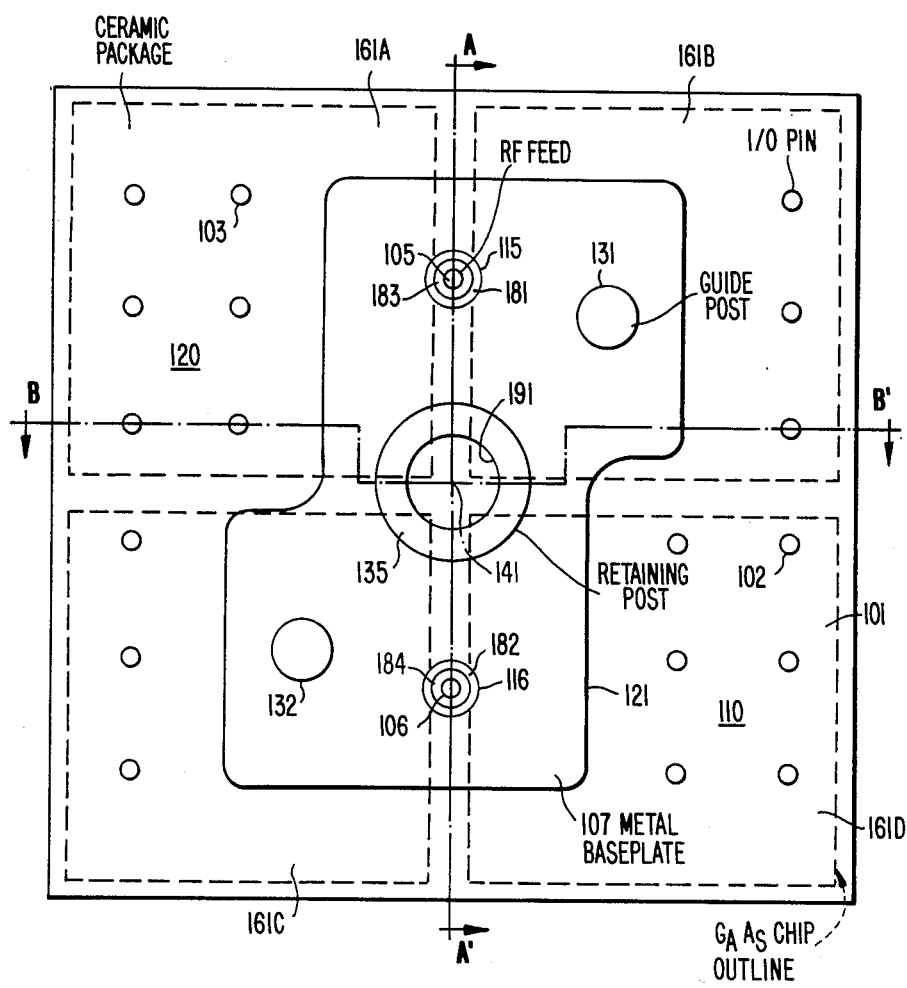
FIG. 3 is a bottom view of an RF chip module shown at 10 in FIG. 1.

For this purpose, a diverging or fan-out arrangement of input/output signal conductor layers or conductor traces 166 is formed on the top surface 189 of the lower ceramic substrate layer 186. First ends of layers 166 are connected, as by way of a suitable conductive paste (such as tungsten or molybdenum-manganese paste), to the bottoms of solid post vias 165 which extend through apertures 164 in the upper ceramic substrate layer 185. Second ends of links 166 are similarly connected to the tops of a set of solid post vias 167 which are provided in spaced apart apertures 168 in the lower ceramic substrate 186 and are contiguous with bonding pads 171 on the bottom surface 101 of substrate layer 186, as shown in FIG. 3. The apertures 164 of substrate layer 185 in which the solid post vias 165 are formed are aligned with and disposed adjacent to the input/output signal coupling ports 163 disposed along the edges of the chips 161 and are wire or ribbon-bonded thereto as shown at 162. As noted above, the physical spacing between signal coupling ports 163 of the RF chips 161 makes it practically unfeasible to connect external coupling pin directly to these locations. Pursuant to the invention, the distribution of signal conductor layers 166 on the top surface 189 of the lower ceramic substrate layer 186 permits the separation between signal coupling pins to be sufficiently large to permit a practical mechanical connection. For this purpose, a plurality of input/output signal pins 102 may be bonded to pads 171 (through the use, for example, of a silver or copper eutectic braze). The center-to-center spacing of pins 102 (each of which may have an outer diameter on the order of 16 mils) may be on the order of 75 mils, which is considerably larger and therefore mechanically preferable from an interconnect and handling standpoint than the spacing between signal coupling ports 163 of chips 161 which is typically only on the order of 35 mils.

In addition to providing a mechanism for practically connecting the signal coupling ports 163 with external pins 102, signal conductor layers 166 also permit the location of pins 102 to be physically spaced apart from the locations of signal coupling ports 163 by a distance sufficient to accommodate the placement of a baseplate 107 made of heat dissipating and electrically conductive material (such as Kovar or copper-tungsten alloy) on the bottom surface 101 of lower ceramic substrate 186.

The manner in which such a metallic baseplate 107 is arranged on the bottom surface 101 of module 10 is illustrated in FIG. 3. As shown therein, baseplate 107 has a somewhat rectangular "S"-shaped configuration with the perimeter 121 thereof accommodating the disposition of respective pluralities of input/output signal pins 102 at spaced apart regions 110 and 120, adjacent to that portion of the bottom surface 101 of module 10 whereat the baseplate 107 is affixed, while still occupying a sufficient portion of the area of the bottom surface 101 of substrate layer 186 to provide substantial heat dissipation therethrough.

In addition to the spaced apart pluralities of input/output signal pins 102, each RF module 10 contains a pair of RF signal coupling ports comprised of center conductors 105/106 which extend through respective concentric cylindrical apertures 115/116 in ceramic substrate layers 185 and 186 and metallic baseplate 107. As shown in FIG. 2 and in further detail in FIG. 4, which is a sectional view taken along line A-A' of FIG. 3, each cylindrical aperture 115/116 which is formed through ceramic substrate layers 185 and 186 and through metallic base plate 107, has a conductive cylindrical outer wall portion 181/182 (such as a Kovar conductor layer) which extends from the top surface 188 of ceramic substrate 185 to the bottom surface 109 of baseplate 107. Between the center conductor 105/106 and cylindrical wall portion 181/182, each RF transmission line aperture is filled with a glass dielectric layer (e.g. Corning 7072 or 7052 sealing glass) 183/184 so as to as define a coaxial transmission line have a characteristic impedance compatible with the RF signal coupling ports of chips 161 (e.g. 50 ohms). The top or interior end of each of center conductor pins 105 and 106 may be wire-bonded, as at 118, to RF signal pad 160 on chip 161. In the bottom view of an RF module 10 shown in FIG. 3, conductor pin 105 may be connected at its interior end portion to the RF signal coupling ports of spaced apart gallium arsenide chips 161A and 161B. Similarly, center conductor pin 106 may be connected to the RF signal coupling ports of gallium arsenide chips 161C and 161D. In other words, pins 105 and 106 provide a power split between the RF signal coupling ports of two adjacent gallium arsenide chips (161A, 161B and 161C, 161D). The impedance characteristics of the connection between the center conductor pin 105/106 and the RF signal ports of the gallium arsenide chips may be tailored in the manner described in co-pending application Ser. No. 888,934 filed July 24, 1986 entitled "Plug-In Package for High Speed Microwave Integrated Circuits" by D. E. Heckaman et al and assigned to the Assignee of the present application.

In addition to the signal interconnection mechanism provided by way of input/output signal pins 102 and RF transmission line center conductor pins 105 and 106, each module 10 is further provided with a mechanical coupling connection comprised of a retaining post 135, having an interior threaded bore 191 and a pair of spaced apart guide posts 131 and 132, each of which extends from the bottom surface 109 of metallic baseplate 107. Guide posts 131 and 132 are aligned with apertures (421/422, respectively, as shown in FIG. 1) in the coldplate/waveguide structure to which the modules are to be attached and have a length which exceeds the length of input/output pins 102 and RF center conductor pins 105 and 106. Retaining post 135 is insertable (along axis 141) into a cylindrical bore 441 (FIGS. 1 and 4) provided in the underlying coldplate/waveguide structure and is affixed thereto by a retaining screw 137 (FIG. 4) inserted from a bottom bore 150 of the coldplate/waveguide structure and threaded into engagement with the interior threaded bore 191 of retaining post 135.

Figure 4:
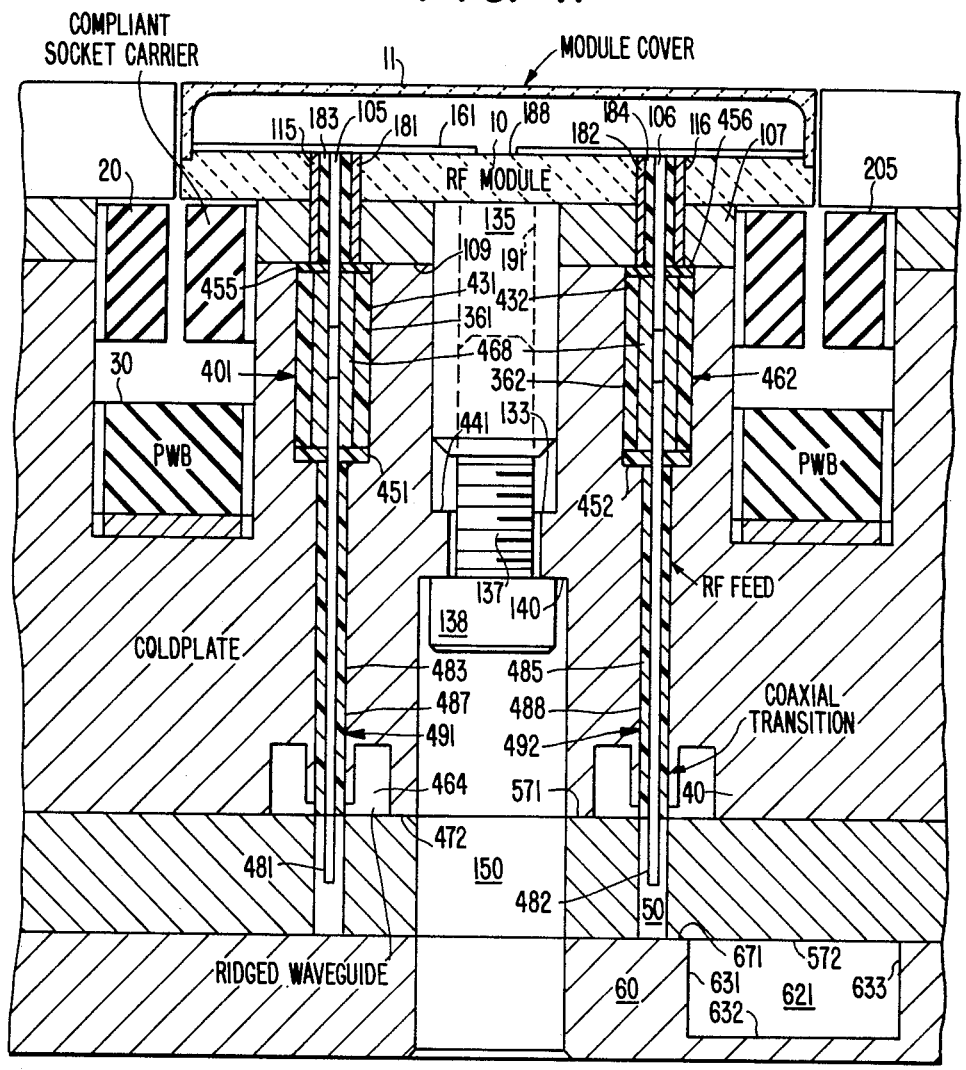
FIG. 4 is a sectional view of module 10 taken along lines A-A' of the bottom view shown in FIG. 3.
Figure 5:
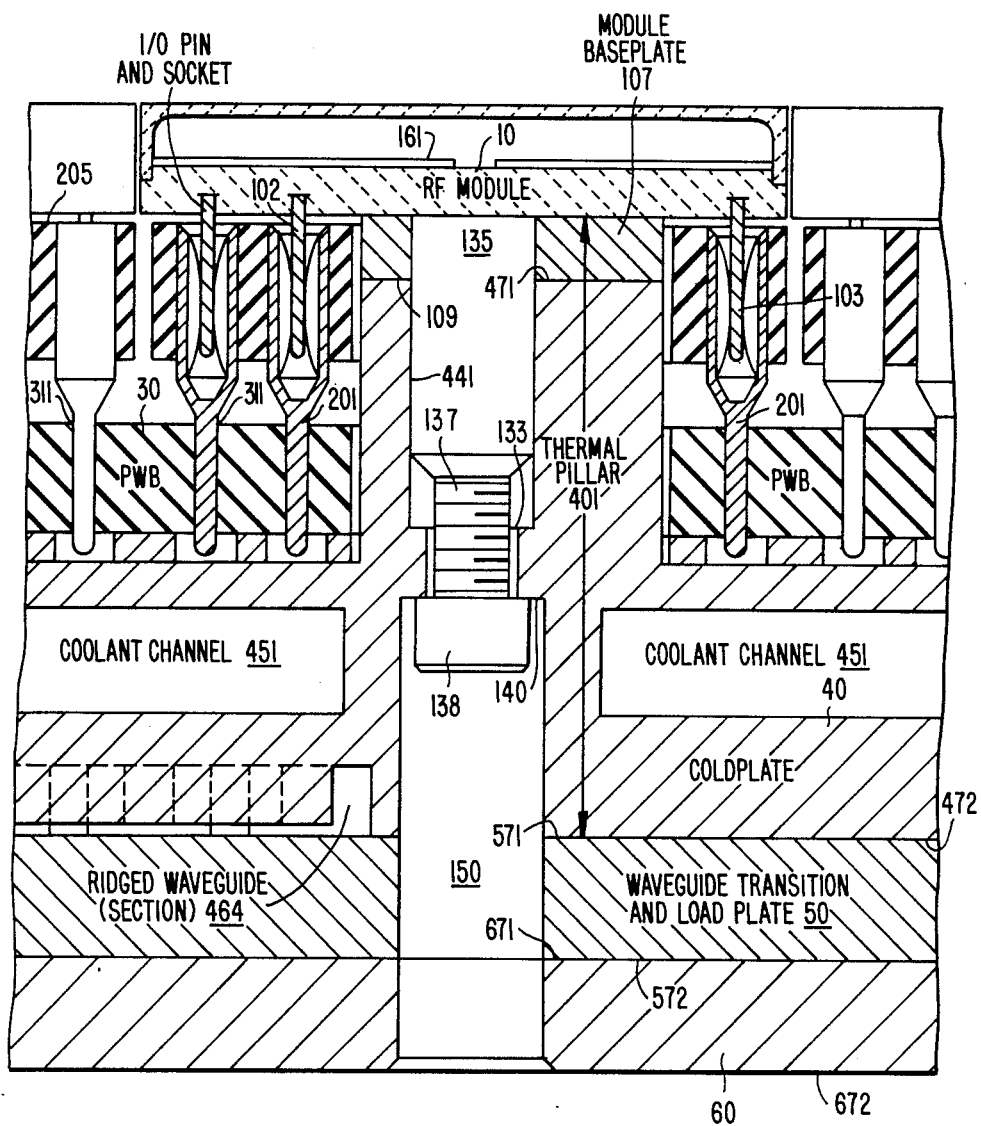
FIG. 5 is a sectional view of the module 10 taken along lines B-B' of the bottom view shown in FIG. 3.

Referring again to FIG. 1 and to FIGS. 4 and 5 the overall interface structure as shown as including a compliant socket carrier 20, a multilayer printed wiring board 30, a coldplate/waveguide element 40, a waveguide transition and load plate element 50 and a bottom waveguide plate element 60. Compliant socket carrier 20 contains a plurality of pin sockets 201 which extend beneath bottom surface 211 and are adapted to receive and engage the pluralities of input/output pins 102/103 of module 10 and to be interconnected with conductive apertures in printed wiring board 30 to which the interconnection links retained therein extend. The outer perimeter of compliant socket carrier 20 is shaped to conform with the substantially rectangular S-shaped perimeter 121 of metallic baseplate 107 and with the rectilinear outer edges of module 10. Compliant socket carrier 20 has a top surface 205 which is disposed adjacent to the bottom surface 101 of ceramic substrate layer 186 of module 10 when the pins 102/103 of RF module 10 engage the pin sockets 201 of carrier 20, as shown in FIG. 5.

The pin sockets 201 of socket carrier 20 are distributed in a pattern corresponding to the pattern of input/output signal pins 102/103 of module 10 and with a plurality of conductive apertures 311 of multilayer printed wiring board 30. Except for its shape, printed wiring board 30 is of conventional construction and includes a plurality of signal conductor tracks formed therein for intercoupling supply voltage levels and control signals to the input/output signal pin sockets 201 and thereby to the pins 102/103 of the RF module 10. The signal conductor links of printed wiring board 30 preferably extend to a multicable connector at a side edge portion of the printed wiring board 30 to which a suitable signal connector cable may be coupled. The conductor highways of the printed wiring board 30 and the cable connector are not shown in the drawings in order to facilitate the illustration of the components of the invention.

As mentioned above, the wiring tracks are of conventional multilayer configuration within the wiring board 30. Uniquely, however, multilayer printed wiring board 30 is mechanically configured to contain a plurality of rectangular "S" shaped slots or apertures 301 which extend completely through the printed wiring board between respective top and bottom surfaces 302 and 303 thereof. Slots 301 are of substantially the same size and shape as a plurality of rectangular S-shaped thermal pillars 401 which are formed in an upper portion of coldplate/waveguide element 40. As noted supra, multilayer printed wiring board 30 also contains a plurality of conductive pin receiving apertures 311 to which the sockets 201 of socket carrier 20 are connected when the socket carrier is inserted into the multilayer printed wiring board 30. The thickness of the printed wiring board 30 and that of the socket carrier (including connector pins 201) are such that, when placed together, their combined thickness is no greater than the height of the thermal pillars 401 of coldplate/waveguide element 40, as shown in FIG. 5.

As shown in FIG. 1, thermal pillars 401 of coldplate/waveguide element 40 are defined by a plurality of depressions 406, having sidewalls 405 which correspond to the sidewalls of the pillars 401, and floors 407. The height or depth of each thermal pillar is defined between the top surface 471 thereof and floor 407. The sidewalls of each thermal pillar 401 have a rectangular S-shaped perimeter which effectively conforms with the rectangular S-shape (FIG. 3) of the sidewalls or perimeter 121 of metallic baseplate 107 of each RF module 10. As a result, when the bottom surface 109 of baseplate 107 of a module 10 is placed in contact with the top surface 471 of a thermal pillar 401, the heat dissipation area of the bottom surface 109 of the metallic baseplate 107 of the RF module 10 encounters a corresponding heat dissipation surface area of thermal pillar 401.

As described above, each thermal pillar 401 also includes a cylindrical bore 441 extending therethrough and sized to accommodate retaining post 135 of RF module 10. Each thermal pillar also includes respective apertures 421 and 422 positioned and size to accommodate guide posts 131 and 132 of module 10 and an additional pair of apertures 431 and 432 containing respective RF transmission line connection sockets 461 and 462 to which the center conductor pins 105 and 106 of the RF module are to be connected (FIG. 4). The location of sockets 461 and 462, apertures 421 and 422 and cylindrical bore 441 are aligned with the corresponding mating electrical and mechanical connection elements on the bottom surface of each RF module, such that the rectangular "S"-shape of bottom plate 107 of module 10 is in substantial alignment with the rectangular "S"-shape of thermal pillar 461.

The manner in which the RF module 10, compliant socket carrier 20 and printed wiring board 30 are stacked and connected together and retained by coldplate/waveguide element 40 is shown in FIGS. 4 and 5. As mentioned previously, retaining post 135 of RF module 10 is insertable into bore 441 of a thermal pillar 401 and is engaged at the interior threaded bore portion 191 thereof by a retaining screw 137 which is insertable through a slot 150 in the opposite side of coldplate/waveguide element 40 such that the head 138 of screw 137 engages a land portion 140 extending to an interior bore 133 through which the shaft of the threaded bolt 137 passes. As screw 137 is tightened into threaded bore 191 of post 135, RF module 10 is drawn toward coldplate/waveguide element 40 until the bottom surface 109 of baseplate 107 engages the top surface 471 of thermal pillar 401. In this mechanical positioning state, with the printed wiring board 30 and compliant socket carrier 20 resting in the pattern of depressions 406 of coldplate/waveguide element 40, the RF module 10, compliant socket carrier 20 and printed wiring board 30 are securely retained by and electrically and thermally connected with coldplate/waveguide element 40. The physical dimensions of depressions 406 and thermal pillars 401 are such as to permit a physical packaging of modules 10 immediately adjacent to one another as shown in FIGS. 4 and 5 and by the broken line illustration in FIG. 1 of a non-detailed RF module 10'.

Advantageously, because the top surface portion of the coldplate/waveguide element 40 contains the above-described pattern of depressions 406 and thermal pillars 401, interconnection of the input/output signal pins 102/103 of the RF modules 10 to the external world can take place easily without the necessity of providing a complicated interface through an underlying waveguide structure which is used to feed the RF pins 105/106. As described above, input/output signal connections to the modules 10 are accommodated via cable connections at the sides of the printed wiring board 30. As a result, interfacing of the RF pins 105/106 is readily accommodated by a pair of coaxial RF socket connector pin shown in detail in FIG. 4.

More particularly, each thermal pillar 401 has a pair of cylindrical apertures 431 and 432 respectively coaxially aligned with the axes of center pins 105 and 106 of each RF module 10. Each aperture 431 and 432 contains therein an RF socket 461 and 462, respectively, having an internal cylindrical dielectric sleeve 361/362 (such as a Teflon tube) within which a conductive compliant spring sleeve element 468/469 is inserted. The inner diameter of sleeve 468/469 when fully mated corresponds to the outer diameter of pins 105/106 and the outer diameter of a coaxial cable center conductor 481/482. At the bottom of each of apertures 431 and 432 a transition washer 451/452 is provided. Similarly, at the top of each aperture a dielectric interface transition washer 455/456 is provided. Each washer has an interior bore which permits the passage of the center conductor pins that are to be joined by way of the sockets 461/462, respectively. The center conductor pins 481/482 of coaxial cable elements 491/492 are surrounded by a dielectric outer sleeve 483/485, extending through respective cylindrical bores 487/488 from the bottom surface 472 of coldplate/waveguide element 40 to apertures 431/432 of sockets 461/462.

The bottom portion of the coldplate/waveguide element 40 is grooved or slotted to form a portion of a ridged waveguide power divider structure 464 to which the center pins 481/482 of the coaxial cable connectors extend, so as to electrically interface the RF ports of the microwave integrated circuit chips to waveguide structure defined between the coldplate/waveguide elements 40 and the top surface 571 of transition and load plate element 50. Element 50 contains feed through apertures (not shown) for interfacing the ridged waveguide structure 464 with a rectangular waveguide structure 621 formed between the bottom surface 572 of element 50 and slots or grooves formed in bottom waveguide plate 60. As shown in FIG. 4, the rectangular waveguide-forming grooves in element 60 have respective parallel sidewalls 631 and 633 and a bottom wall or floor portion 632 which is parallel to the surface 572 of plate 50 against which the top surface 671 of bottom plate element 60 is placed. Bottom plate 60 is shown having a bottom surface 672. The distribution of rectangular waveguides 621 in bottom plate element 60, may for example, form a 64:1 powder divider to which an original output signal to be delivered to the emitter elements of the microwave chips is supplied. As the configuration and operation of such waveguide power divider structure is conventional and is not necessary for an understanding of the present invention no further details will be given here. Suffice it to say that the rectangular waveguide structure 621 formed in element 60 serves to distribute a signal to be launched with an intended power distribution from a multiarray antenna. A second layer of power distribution is accomplished by the ridged waveguide 464 defined between top surface 571 of transition and load plate element 50 and the side walls of the grooves through which the ridged waveguide structure 464 is formed in the bottom surface 472 of coldplate/waveguide element 40. For example, the configuration of the ridged waveguide structure 464 may comprise an arrangement of 64 8:1 power dividers feeding the respective emitter elements of the chips contained in modules 10 through the transmission line center conductor pins 481/482, extending therebetween, as described supra.

Because of the substantial thickness of metal provided by coldplate/waveguide element 40, transition and load plate element 50 and rectangular waveguide element 60, the module support structure of the present invention provides considerable heat dissipation for the RF module 10. Additional cooling is provided by a plurality of coolant channels 451 formed in coldplate/waveguide element 40, through which a cooling fluid may pass for augmenting the heat dissipation characteristics of the structure.

As will be appreciated from the foregoing description, the present invention provides a packaging mechanism for housing a plurality of high frequency monolithic integrated circuit chips that not only ruggedizes the signal interface connectors but provides substantial heat dissipation and avoids complex hardware constraints of conventional packaging arrangements where all signal interface ports are derived from the same side of the packaging structure. Through the use of the distribution of depressions and thermal pillars in the coldplate/waveguide element, the printed wiring board structure, through which chip control signals are supplied, may be disposed in substantially the immediately adjacent vicinity of the RF modules, rather than being placed in the vicinity of the waveguide structure which creates the practical problem of a dual interface across the thickness of the mounting hardware. Input/output signals can be extracted at the side of the printed wiring boards away from the ports whereat RF signals are interconnected with the waveguide structure of rectangular waveguide element. This also permits a simplified interconnection scheme comprised of coaxial transmission line connector pins in direct alignment with the RF connectors of each RF module and the waveguide structure therebeneath.

While I have shown and described an embodiment in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed is:

1. An arrangement for supporting and intercoupling at least one signal processing device to signal interface ports comprising:

a device support module comprised of a substrate supporting at least one signal processing device on a first surface thereof, a plurality of input/output signal connector means disposed at a first portion of a second surface of said substrate and interconnected through said substrate to ones of signal connection ports of said at least one signal processing device, an electrically and thermally conductive plate disposed on a second portion of said second surface of said substrate adjacent to said first portion thereof, said plate having signal coupling links extending through apertures in said plate to others of said signal connection ports of said at least one signal processing device; and means for physically attaching said module to a transmission link support structure.

2. An arrangement according to claim 1, said signal processing device comprises a monolithic microwave integrated circuit device, said signal coupling links extending through said plate include microwave signal coupling links extending through apertures therethrough to microwave signal coupling ports of said at least one microwave signal processing device, and said transmission link support structure comprises a microwave transmission link support structure, and wherein said microwave transmission link support structure comprises an electrically and thermally conductive member having a first surface thereof disposed in electrical and thermal communication with said thermally conductive plate and containing an internal distribution of waveguide elements, and means for providing respective microwave signal transmission links between microwave signal coupling links of said module and said internal distribution of waveguide elements.

3. An arrangement according to claim 2, further including an input/output signal interconnect link support member containing a plurality of input/output signal transmission links for interfacing input/output signals with the input/output signal connector means of said module and having a physical shape that enables said interconnect link support member to be disposed adjacent to said electrically and thermally conductive plate between said first portion of said second surface of said substrate and said first surface of said electrically and thermally conductive member when said electrically and thermally conductive plate is placed in electrical and thermal communication with said first surface of said electrically and thermally conductive member.

4. An arrangement according to claim 3, wherein said first surface of said electrically and thermally conductive member of said microwave transmission link support structure has a plurality of depressions formed therein, said depressions defining therebetween a plurality of pillar portions, the shapes of said pillar portions effectively accommodating the shapes of the plates of modules disposed in electrical and thermal communication therewith by being mounted atop respective ones of said pillar portions.

5. An arrangement according to claim 4, wherein said input/output signal interconnect link support member has a physical shape that enables said interconnect link support member to be disposed within the depressions of said electrically and thermally conductive member of said microwave transmission link support structure adjacent to the pillar portions thereof.

6. An arrangement according to claim 5, further comprising means, disposed between said first portion of said second surface of a respective module and said input/output signal interconnect link support member and shaped to be disposed within the depressions of said electrically and thermally conductive member of said microwave transmission link support structure, for electrically intercoupling input/output signal connector means of said module with input/output signal transmission links of said input/output signal interconnect link support member.

7. An arrangement according to claim 6, wherein said electrically intercoupling means comprises respective input/output signal pin socket carriers each having a plurality of input/output signal pin socket connectors disposed in alignment with a respective plurality of input/output signal pins of which said input/output signal connector means of said module are comprised and being mounted in a respective one of said depressions such that said socket connectors thereof electrically intercouple input/output signal pins of said module and input/output signal transmission links of said interconnect link support member.

8. An arrangement according to claim 7, wherein the combined effective thickness of a socket carrier and said interconnect link support member is no greater than the depths of said depressions.

9. An arrangement according to claim 2, wherein said electrically and thermally conductive member of said microwave transmission link support structure contains a plurality of cooling channels distributed therein through which cooling fluid may pass to assist in the cooling of said at least one monolithic microwave signal processing module.

10. An arrangement according to claim 1, wherein the substrate of said module comprises a first substrate layer having a top surface corresponding to the first surface of said substrate and supporting a plurality of monolithic signal processing devices thereon, and a second substrate layer having a top surface on which said first substrate layer is disposed and a bottom surface corresponding to the second surface of said substrate, said second substrate layer having disposed on the top surface thereof a plurality of conductor links disposed between locations of said second substrate layer in alignment with locations of input/output signal connector means at the second surface of said substrate and locations of said second substrate layer in alignment with locations whereat connections through said first substrate layer to said ones of said signal connection ports of said plurality of monolithic signal processing devices are provided.

11. An arrangement according to claim 10, wherein each of said signal coupling links comprises a center conductor pin extending through a dielectric-filled aperture in said first and second substrate layers and being connected to a microwave signal connection port of a microwave signal processing device supported on the top surface of said first substrate layer, the sidewalls of said aperture being electrically conductive and forming a ground plane for said center conductor pin.

12. An arrangement according to claim 3, wherein each module includes a plurality of guide pins extending from said plate for aligning said module with respect to a corresponding plurality of guide holes formed in said support structure and sized to receive and engage said guide pins.

13. An arrangement according to claim 12, wherein the substrate of said module comprises a first substrate layer having a top surface corresponding to the first surface of said substrate and supporting a plurality of monolithic signal processing devices thereon, and a second substrate layer having a top surface on which said first substrate layer is disposed and a bottom surface corresponding to the second surface of said substrate, said second substrate layer having disposed on the top surface thereof a plurality of conductor links disposed between locations of said second substrate layer in alignment with locations of input/output signal connector means at the second surface of said substrate and locations of said second substrate layer in alignment with locations whereat connections through said first substrate layer to said ones of said signal connection ports of said plurality of monolithic signal processing devices are provided.

14. An arrangement according to claim 13, wherein each of said microwave signal coupling links comprises a center conductor pin extending through a dielectric-filled aperture in said first and second substrate layers and being connected to a microwave signal connection port of a microwave signal processing device supported on the top surface of said first substrate layer, the sidewalls of said aperture being electrically conductive and forming a ground plane for said center conductor pin.

15. An arrangement according to claim 14, wherein said first surface of said electrically and thermally conductive member of said microwave transmission link support structure has a plurality of depressions formed therein, said depressions defining therebetween a plurality of pillar portions, the shapes of said pillar portions effectively accommodating the shapes of the plates of modules disposed in electrical and thermal communication therewith by being mounted atop respective ones of said pillar portions.

16. An arrangement according to claim 15, wherein a respective one of said pillar portions includes a plurality of microwave transmission line pin sockets into which said center conductor pins of microwave signal coupling links are insertable, said pin sockets being coupled with respective microwave signal transmission links to said internal distribution of waveguide elements.

17. An arrangement according to claim 1, wherein said monolithic microwave signal processing devices contain microwave signal amplifier and antenna emitter elements coupled thereto for amplifying and launching radio frequency signals at a frequency in excess of 20 GHz.

18. A module for supporting and intercoupling at least one signal processing device to signal interface ports external thereto comprising a substrate supporting at least one signal processing device on a first surface thereof, a plurality of input/output signal connector means located at a first portion of a second surface of said substrate and interconnected through said substrate to ones of signal connection ports of said at least one signal processing device, an electrically and thermally conductive plate disposed on a second portion of said second surface of said substrate adjacent to said first portion thereof said plate having signal coupling links extending through apertures in said plate to others of said signal connection ports of said at least one signal processing device, and means for physically attaching said substrate and said plate to a signal transmission link support structure.

19. A module according to claim 18, wherein said substrate comprises a first substrate layer having a top surface corresponding to the first surface of said substrate and supporting a plurality of monolithic signal processing devices thereon, and a second substrate layer having a top surface on which said first substrate layer is disposed and a bottom surface corresponding to the second surface of said substrate, said second substrate layer being disposed on the top surface thereof a plurality of conductor links disposed between locations of said second substrate layer in alignment with locations of input/output signal connector means at the second surface of said substrate and locations of said second substrate layer in alignment with locations whereat connections through said first substrate layer to said ones of said signal connection ports of said plurality of monolithic signal processing devices are provided.

20. A module according to claim 19, wherein said signal processing device comprises a monolithic microwave signal processing device, said signal coupling links comprise microwave signal coupling links, and said signal connection ports include microwave signal connection ports, and wherein each of said microwave signal coupling links comprises a center conductor pin extending through a dielectric-containing aperture in said first and second substrate layers and being connected to a microwave signal connection port of a microwave signal processing device supported on the top surface of said first substrate layer, the sidewalls of said aperture being electrically conductive and forming a ground plane for said center conductor pin.

21. A module according to claim 20, further comprising a plurality of guide pins extending from said plate for aligning said module with respect to a corresponding plurality of guide holes formed in a support structure to which said module is to be attached.

22. A module according to claim 21, wherein said monolithic microwave signal processing devices contain microwave signal amplifier and antenna emitter elements coupled thereto for amplifying and launching radio frequency signals at a frequency in excess of 20 GHz.

23. A structure for supporting and interfacing with signal interface ports a plurality of modules containing signal processing devices, said structure comprising an electrically and thermally conductive member having a plurality of depressions formed in a first surface thereof, said depressions defining therebetween a plurality of pillar portions, the shapes of said pillar portions effectively accommodating the shapes of prescribed portions of signal processing modules to be placed in electrical and thermal communication therewith by being mounted atop respective ones of said pillar portions, a respective pillar portion including means for mechanically attaching a module thereto and having formed therein means for providing a signal transmission link between said module and a signal interface port at a second surface of said conductive member, and wherein said depressions are shaped to accommodate therein a signal interconnect link member containing a plurality of signal conductors engageable with signal coupling ports of modules mounted on said pillar portions.

24. A structure according to claim 23, wherein said signal processing devices include microwave integrated circuit devices having microwave signal coupling port connections extending from said modules for engagement with said signal transmission link providing means of said pillar portions, said signal transmission link providing means comprising microwave transmission lines extending through said pillar portions to microwave signal coupling ports at said second surface of said conductive member.

25. A structure according to claim 24, wherein said conductive member further comprises a distribution of waveguide elements formed therein with which said microwave transmission lines are coupled.

26. A structure according to claim 24, wherein a signal interconnect link member is disposed within said depressions and wherein said microwave integrated circuit devices have a plurality of input/output signal port connections extending from said modules and being coupled to signal conductors of said link member.

27. A structure according to claim 24, further including respective input/output signal pin socket carriers each having a plurality of input/output signal pin socket connectors disposed in alignment with a respective plurality of input/output signal port connections of a module and being disposed in a respective one of said depressions such that said signal pin socket connectors thereof electrically intercouple input/output signal port connectors of said module with signal conductors of said link member.

* * * * *

UNITED STATES PATENT AND TRADEMARK OFFICE
CERTIFICATE OF CORRECTION

PATENT NO. : 4,771,294

DATED : September 13, 1988

INVENTOR(S) : Peter A. Wasilousky

It is certified that error appears in the above—identified patent and that said Letters Patent is hereby corrected as shown below:

In the Specification, Column 1, between lines 3 and 5 the following paragraph should be inserted.

-- The United States Government has rights in the present patent under U.S. Government Contract No. F19628-83-C-0015.--

Signed and Sealed this

Twenty-first Day of November, 1989

Attest:

JEFFREY M. SAMUELS

Attesting Officer     Acting Commissioner of Patents and Trademarks